(12) United States Patent
Hocevar

(10) Patent No.: US 7,139,959 B2
(45) Date of Patent: Nov. 21, 2006

(54) LAYERED LOW DENSITY PARITY CHECK DECODING FOR DIGITAL COMMUNICATIONS

(75) Inventor: Dale E. Hocevar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 449 days.

(21) Appl. No.: 10/806,879

(22) Filed: Mar. 23, 2004

(65) Prior Publication Data

US 2004/0194007 A1    Sep. 30, 2004

Related U.S. Application Data

(60) Provisional application No. 60/457,003, filed on Mar. 24, 2003.

(51) Int. Cl.
H03M 13/11   (2006.01)

(52) U.S. Cl. .................................... 714/752

(58) Field of Classification Search ............... 714/752; H03M 13/11
See application file for complete search history.

(56) References Cited

U.S. PATENT DOCUMENTS

| | | | |
|---|---|---|---|
| 5,406,570 A | 4/1995 | Berrou et al. | |
| 5,446,747 A | 8/1995 | Berrou et al. | |
| 5,563,897 A | 10/1996 | Pyndiah et al. | |
| 5,630,156 A | 5/1997 | Privat et al. | |
| 6,023,783 A | 2/2000 | Divsalar et al. | |
| 6,065,147 A | 5/2000 | Pyndiah et al. | |
| 6,108,388 A | 8/2000 | Douillard et al. | |
| 6,119,264 A | 9/2000 | Berrou et al. | |
| 6,122,763 A | 9/2000 | Pyndiah et al. | |
| 6,539,367 B1 | 3/2003 | Blanksby et al. | |
| 6,633,856 B1 | 10/2003 | Richardson et al. | |
| 2003/0023917 A1* | 1/2003 | Richardson et al. | ........ 714/749 |
| 2003/0033575 A1 | 2/2003 | Richardson et al. | |
| 2003/0043487 A1 | 3/2003 | Morita et al. | |
| 2003/0065989 A1 | 4/2003 | Yedida et al. | |
| 2003/0104788 A1 | 6/2003 | Kim | |
| 2004/0034828 A1 | 2/2004 | Hocevar | |

OTHER PUBLICATIONS

Tanner, et al., "A Class of Group-Structured LDPC Code", ISTA-2001 Proc. (Ambleside, England, 2001).
Richardson, et al., "Design of Capacity-Approaching Irregular Low-Density Parity Check Codes", IEEE Trans. on Information Theory, vol. 47, No. 2 (Feb. 2001), pp. 619-637.

(Continued)

Primary Examiner—R. Stephen Dildine
(74) Attorney, Agent, or Firm—Steven A. Shaw; W. James Brady; Frederick J. Telecky, Jr.

(57) ABSTRACT

A low density parity check (LDPC) code that is particularly well adapted for hardware implementation of a belief propagation decoder circuit (38) is disclosed. The LDPC code is arranged as a parity check matrix (H) whose rows and columns represent check sums and input nodes, respectively. The parity check matrix is grouped into subsets of check sum rows, in which the column weight is a maximum of one. The decoder circuitry includes a parity check value estimate memory (52). Adders (54) generate extrinsic estimates, from immediately updated input node probability estimates, and the extrinsic estimates are applied to parity check update circuitry (56) for generating new parity check sum value estimates. These parity check sum value estimates are stored back into the memory (52), and after addition with the extrinsic estimates, are stored in a column sum memory (66) of a corresponding bit update circuit (60) as updated probability values for the input nodes.

17 Claims, 5 Drawing Sheets

OTHER PUBLICATIONS

Richardson, et al., "Efficient Encoding of Low-Density Parity-Check Codes", IEEE Trans. on Information Theory, vol. 47, No. 2 (Feb. 2001), pp. 638-656.

Zhang, et al., "VLSI Implementation-Oriented (3,k)-Regular Low-Density Parity-Check Codes", IEEE Workshop on Signal Processing Systems (Sep. 2001), pp. 25-36.

Boutillon, et al., "Decorder-First Code Design", Proc.: Int'l Symp. on Turbo Codes and Related Topics (Brest, France, Sep. 2001).

Sridhara, et al., "Low Density Parity Check Codes from Permutation Matrices", 2001 Conference on Information Sciences and Systems (Johns Hopkins University, Mar. 12, 2001).

Li, et al., "Generalized Product Accumulate Codes: Analysis and Performance", Global Communications Conference (Globecomm)(IEEE, 2001), pp. 975-979.

Mansour, et al., "Turbo Decoder Architectures for Low-Density Parity Check Codes", Global Communications Conference (Globecomm) (IEEE, 2002), pp. 1383-1388.

Mansour, et al., "On the Architecture-Aware Structure of LDPC Codes from Generalized Ramanujan Graphs and their Decoder Architectures", 2003 Conf. Inf. Sci. (Mar. 12, 2002).

Chung et al., "Analysis of Sum-Product Decoding of Low-Density Parity-Check Codes using a Gaussian Approximation", Trans. Inf. Theory, V. 47, No. 2 (IEEE, Feb. 2001). 657-70.

Gallager, Low-Density Parity-Check codes (MIT Press, 1963).

Mackay, et al., "Comparison of Constructions of Irregular Gallager Codes", Trans. Comm., vol. 47, No. 10 (IEEE, Oct. 1999), pp. 1449-1454.

\* cited by examiner

FIG. 3

|    | 1 | 2 | 3 | 4 | 5 | 6 | 7 | 8 | 9 | 10 | 11 | 12 |    |
|----|---|---|---|---|---|---|---|---|---|----|----|----|----|
| 24 | 1 | 1 | 1 | 1 | 1 | 1 | 1 | 1 | 1 | 1  | 1  | 1  | 11 |
|    | 7 | 7 | 7 | 7 | 7 | 7 | 8 | 7 | 7 | 7  | 7  | 8  |    |
|    | 1 | 1 | 1 | 1 | 1 | 1 | 1 | 1 | 1 | 1  | 1  | 1  | 11 |
|    | 1 | 1 | 1 | 1 | 1 | 1 | 1 | 1 | 1 | 1  | 1  | 1  | 11 |
|    |   |   |   |   |   |   | 1 |   |   | 1  | 1  | 1  | 4  |
| 20 |   |   |   |   |   |   | 1 |   |   |    | 1  | 1  | 3  |
|    |   |   |   | 1 |   |   | 1 | 1 |   |    |    |    | 3  |
|    |   |   | 1 |   | 1 |   |   |   |   | 1  |    |    | 3  |
|    | 1 | 1 |   |   |   | 1 |   |   |   | 1  |    |    | 3  |
| 16 | 1 |   |   |   |   | 1 |   |   |   |    |    | 1  | 3  |
|    |   |   |   |   |   |   |   |   |   | 1  | 1  | 1  | 3  |
|    |   |   |   |   | 1 | 1 | 1 |   |   |    |    |    | 3  |
| 12 |   |   |   | 1 | 1 | 1 |   |   |   |    |    |    | 3  |
|    | 1 | 1 | 1 |   |   |   |   |   |   |    |    |    | 3  |
|    |   |   |   |   | 1 | 1 |   |   |   |    |    |    | 2  |
|    |   |   |   | 1 |   |   | 1 |   |   |    |    |    | 2  |
| 8  |   | 1 |   |   |   |   |   | 1 |   |    |    |    | 2  |
|    | 1 |   |   |   |   |   |   |   | 1 |    |    |    | 2  |
|    |   |   |   |   |   |   |   |   |   | 1  | 1  |    | 2  |
|    |   |   |   |   |   |   |   |   | 1 | 1  |    |    | 2  |
| 4  |   |   |   |   |   | 1 | 1 |   |   |    |    |    | 2  |
|    |   |   |   | 1 | 1 |   |   |   |   |    |    |    | 2  |
|    |   |   | 1 | 1 |   |   |   |   |   |    |    |    | 2  |
|    | 1 | 1 |   |   |   |   |   |   |   |    |    |    | 2  |

US 7,139,959 B2

LAYERED LOW DENSITY PARITY CHECK DECODING FOR DIGITAL COMMUNICATIONS

CROSS-REFERENCE TO RELATED APPLICATIONS

This application claims priority, under 35 U.S.C. §119(e), of Provisional Application No. 60/457,003, filed Mar. 24, 2003.

STATEMENT REGARDING FEDERALLY SPONSORED RESEARCH OR DEVELOPMENT

Not Applicable

BACKGROUND OF THE INVENTION

This invention is in the field of digital data communications, and is more specifically directed to decoding of transmissions that have been coded for error detection and correction.

High-speed data communications, for example in providing high-speed Internet access, is now a widespread utility for many businesses, schools, and homes. At this stage of development, such access is provided according to an array of technologies. Data communications are carried out over existing telephone lines, with relatively slow data rates provided by voice band modems (e.g., according to the current v.92 communications standards), and at higher data rates using Digital Subscriber Line (DSL) technology. Another modern data communications approach involves the use of cable modems communicating over coaxial cable, such as provided in connection with cable television services. The Integrated Services Digital Network (ISDN) is a system of digital phone connections over which data is transmitted simultaneously across the world using end-to-end digital connectivity. Localized wireless network connectivity according to the IEEE 802.11 standard has become very popular for connecting computer workstations and portable computers to a local area network (LAN), and often through the LAN to the Internet. Wireless data communication in the Wide Area Network (WAN) context, which provides cellular-type connectivity for portable and hand-held computing devices, is expected to also grow in popularity.

A problem that is common to all data communications technologies is the corruption of data due to noise. As is fundamental in the art, the signal-to-noise ratio for a communications channel is a degree of goodness of the communications carried out over that channel, as it conveys the relative strength of the signal that carries the data (as attenuated over distance and time), to the noise present on that channel. These factors relate directly to the likelihood that a data bit or symbol received over the channel is in error relative to the data bit or symbol as transmitted. This likelihood is reflected by the error probability for the communications over the channel, commonly expressed as the Bit Error Rate (BER) ratio of errored bits to total bits transmitted. In short, the likelihood of error in data communications must be considered in developing a communications technology. Techniques for detecting and correcting errors in the communicated data must be incorporated for the communications technology to be useful.

Error detection and correction techniques are typically implemented through the use of redundant coding of the data. In general, redundant coding inserts data bits into the transmitted data stream that do not add any additional information, but that indicate whether an error is present in the received data stream. More complex codes provide the ability to deduce the true transmitted data from a received data stream, despite the presence of errors.

Many types of redundant codes that provide error correction have been developed. One type of code simply repeats the transmission, for example repeating the payload twice, so that the receiver deduces the transmitted data by applying a decoder that determines the majority vote of the three transmissions for each bit. Of course, this simple redundant approach does not necessarily correct every error, but greatly reduces the payload data rate. In this example, a predictable likelihood remains that two of three bits are in error, resulting in an erroneous majority vote despite the useful data rate having been reduced to one-third. More efficient approaches, such as Hamming codes, have been developed toward the goal of reducing the error rate while maximizing the data rate.

The well-known Shannon limit provides a theoretical bound on the optimization of decoder error as a function of data rate. The Shannon limit provides a metric against which codes can be compared, both in the absolute and relative to one another. Since the time of the Shannon proof, modern data correction codes have been developed to more closely approach the theoretical limit. An important type of these conventional codes are "turbo" codes, which encode the data stream by applying two convolutional encoders. One convolutional encoder encodes the datastream as given, while the other encodes a pseudo-randomly interleaved version of the data stream. The results from the two encoders are interwoven to produce the output encoded data stream.

Another class of known redundant codes is the Low Density Parity Check code. According to this class of codes, a sparse matrix H defines the code, with the encodings, or codewords, c of the payload data satisfying:

$$Hc = 0 \qquad (1)$$

over Galois field GF(2). Each codeword c consists of the source message s combined with the corresponding parity check bits for that source message s. The encodings c are transmitted, with the receiving network element receiving a signal vector r=c+n, n being the noise added by the channel. Because the decoder at the receiver knows matrix H, it can compute a vector z=Hr. However, because r=c+n, and because Hc=0:

$$z = Hr = Hc + Hn = Hn \qquad (2)$$

The decoding process thus involves finding the sparsest vector x that satisfies the equation:

$$Hx = z \qquad (3)$$

over GF(2). The vector x becomes the best guess for noise vector n, which can be subtracted from the received signal vector r to recover encodings c, from which the original source message s is recoverable. There are many examples of LDPC codes that are known in the art, some of which have been described as providing code performance that approaches the Shannon limit, as described in Tanner et al., "A Class of Group-Structured LDPC Codes", *ISTCA*-2001 *Proc.* (Ambleside, England, 2001).

However, high-performance LDPC code decoders are difficult to implement into hardware. While Shannon's adage holds that random codes are good codes, it is regularity that allows efficient hardware implementation. To address this difficult tradeoff between code irregularity and hardware efficiency, the technique of belief propagation provides an iterative implementation of LDPC decoding that can be made somewhat efficient, as described in Richardson, et al., "Design of Capacity—Approaching Irregular Low-Density Parity Check Codes," *IEEE Trans. on Information Theory*, Vol. 47, No. 2 (February 2001), pp. 619–637; and in Zhang et al., "VLSI Implementation-Oriented (3,k)-Regular Low-Density Parity-Check Codes", *IEEE Workshop on Signal Processing Systems* (September 2001), pp. 25.–36. Belief propagation decoding algorithms are also referred to in the art as probability propagation algorithms, message passing algorithms, and as sum-product algorithms.

In summary, belief propagation algorithms are based on the binary parity check property of LDPC codes. As mentioned above and as known in the art, each check vertex in the LDPC code constrains its neighboring variables to form a word of even parity. In other words, the product of the correct LDPC code word vector with each row of the parity check matrix sums to zero. According to the belief propagation approach, the received data are used to represent the input probabilities at each input node (also referred to as a "bit node") of a bipartite graph having input nodes and check nodes. Within each iteration of the belief propagation method, bit probability messages are passed from the input nodes to the check nodes, updated according to the parity check constraint, with the updated values sent back to and summed at the input nodes. The summed inputs are formed into log likelihood ratios (LLRs) defined as:

$$L(c) = \log\left(\frac{P(c=0)}{P(c=1)}\right) \quad (4)$$

where c is a coded bit received over the channel.

In its conventional implementation, the belief propagation algorithm uses two value arrays, a first array L storing the LLRs for j input nodes, and the second array R storing the results of m parity check node updates, with m being the parity check row index and j being the column (or input node) index of the parity check matrix H. The general operation of this conventional approach determines, in a first step, the R values by estimating, for each check sum (row of the parity check matrix) the probability of the input node value from the other inputs used in that checksum. The second step of this algorithm determines the LLR probability values of array L by combining, for each column, the R values for that input node from parity check matrix rows in which that input node participated. A "hard" decision is then made from the resulting probability values, and is applied to the parity check matrix. This two-step iterative approach is repeated until the parity check matrix is satisfied (all parity check rows equal zero, GF(2)), or until another convergence criteria is reached, or a terminal number of iterations have been executed.

By way of further background, the code design approach described in Boutillon et al., "Decoder-First Code Design", *Proc.: Int'l Symp. on Turbo Codes and Related Topics* (Brest, France, September 2001) defines the decoder architecture first, and uses this architecture to constrain the design of the LDPC code itself. Sridhara, et al., "Low Density Parity Check Codes from Permutation Matrices", 2001 *Conference on Information Sciences and Systems* (Johns Hopkins University, Mar. 21–23, 2001) describes the LDPC code as constructed from shifted identity matrices (i.e., permutation matrices).

However, it has been observed that these prior approaches are somewhat limited, in that these approaches are limited to a single code or a small selection of codes. Practically useful communications receivers require some amount of flexibility in code rates, and in optimizing their operation for varying noise levels and channel conditions. As a result of this observation, my copending and commonly assigned application Ser. No. 10/329,597 filed Dec. 26, 2002, published as U.S. Patent Application Publication No. US 2004/0034828 A1, and incorporated herein by this reference describes a low density parity check (LDPC) code that is particularly well adapted for efficient hardware implementation in a belief propagation decoder circuit. As described in this copending application, the LDPC code is arranged as a macro matrix whose rows and columns represent block columns and block rows of a corresponding parity check matrix. Each non-zero entry corresponds to a permutation matrix, such as a cyclically shifted identity matrix, with the shift corresponding to the position of the permutation matrix entry in the macro matrix. The block columns of the macro matrix are grouped, so that only one column in the macro matrix group contributes to the parity check sum in any given row. The decoder circuitry includes a parity check value estimate memory which may be arranged in banks that can be logically connected in various data widths and depths. A parallel adder generates extrinsic estimates that are applied to parity check update circuitry for generating new parity check value estimates. These parity check value estimates are stored back into the memory, and are forwarded to bit update circuits for updating of probability values for the input nodes.

By way of further background, my copending and commonly assigned application Ser. No. 10/724,280, filed Nov. 28, 2003 published as U.S. Patent Application Publication No. US 2004/0148560, and incorporated herein by this reference, describes encoder circuitry for applying a low-density parity check (LDPC) code, such as that described in the above-referenced Patent Application Publication US 2004/0034828 A1, to information words to be transmitted.

By way of still further background, Li et al., "Generalized Product Accumulate Codes: Analysis and Performance", *Global Communications Conference* (*Globecomm*) (IEEE, 2001), pp. 975–79, describe a layered approach to the outer code of product accumulate codes. It is observed that these outer codes (referred to in the paper as "turbo" product codes) are layered LDPC codes, with each layer decoded by way of belief propagation. It is also observed that, because the column weight in each layer is at most one, only a single iteration is possible within each layer.

By way of still further background, Mansour, et al., "Turbo decoder architectures for low-density parity check codes", *Global Communications Conference* (*Globecomm*) (IEEE, 2002), pp. 1383–88; and Mansour, et al., "On the Architecture-Aware Structure of LDPC Codes from Generalized Ramanujan Graphs and their Decoder Architectures", 2003 *Conference on Information Sciences and Systems* (Johns Hopkins University, Mar. 12, 2002), also describe a layered, or "turbo", approach for LDPC decoding. In these articles, the LDPC parity check matrices are block partitioned into columns and rows, with a maximum column weight of one in each layer. These articles assert that the layered approach reduces the number of iterations necessary for decoding, relative to belief propagation decoding that does not use layered decoding.

BRIEF SUMMARY OF THE INVENTION

It is therefore an object of this invention to provide an LDPC decoder that can be efficiently implemented in an integrated circuit.

It is a further object of this invention to provide such an LDPC decoder in which significant efficiencies in the speed of decoding can be attained.

It is a further object of this invention to provide such an LDPC decoder in which the memory resources required for decoding can be greatly reduced relative to previous implementations.

It is a further object to provide such an LDPC decoder in which the integrated circuit area required for memory and logic resources can be greatly reduced relative to previous implementations.

Other objects and advantages of this invention will be apparent to those of ordinary skill in the art having reference to the following specification together with its drawings.

The present invention may be implemented in connection with a network receiver, having a decoder that implements a Low-Density Parity-Check (LDPC) code for retrieving the transmitted message. The LDPC code is implemented according to a block parity check matrix consisting of an irregular arrangement of cyclically shifted identity matrices. Each block, or subset, of the parity check matrix has a maximum column weight of one. A decoder architecture for this code includes a column sum memory that receives the received input data, and that stores updated values for the input node predictions. A reversible router block forwards these updated input node predictions, which are available immediately after the update because of the layered nature of the code, to adders that subtracts prior parity check values therefrom. Parity check update blocks and adders then generate new updated input node predictions. Because the block rows of the LDPC parity check matrix are considered as layers, the full code result corresponds to the intersection of the component codes.

BRIEF DESCRIPTION OF THE SEVERAL VIEWS OF THE DRAWING

FIG. 3 is an example of an LDPC code macro matrix according to the preferred embodiment of the invention.

DETAILED DESCRIPTION OF THE INVENTION

The present invention will be described in connection with an example of its implementation in an exemplary transceiver, for example a wireless network adapter such as according to the IEEE 802.11 wireless standard. It will be apparent to those skilled in the art having reference to this specification that this invention is particularly well-suited for use in such an application. However, it is also contemplated that this invention will be of similar benefit in many other applications that involve error correction coding, including communications according to orthogonal frequency division multiplexing (OFDM), discrete multitone modulation (DMT) for example as used in conventional Digital Subscriber Line (DSL) modems, and other modulation and communication approaches, whether carried out as land line or wireless communications. It is therefore to be understood that these and other alternatives to and variations on the embodiment described below are contemplated to be within the scope of the invention as claimed.

Figure 1:
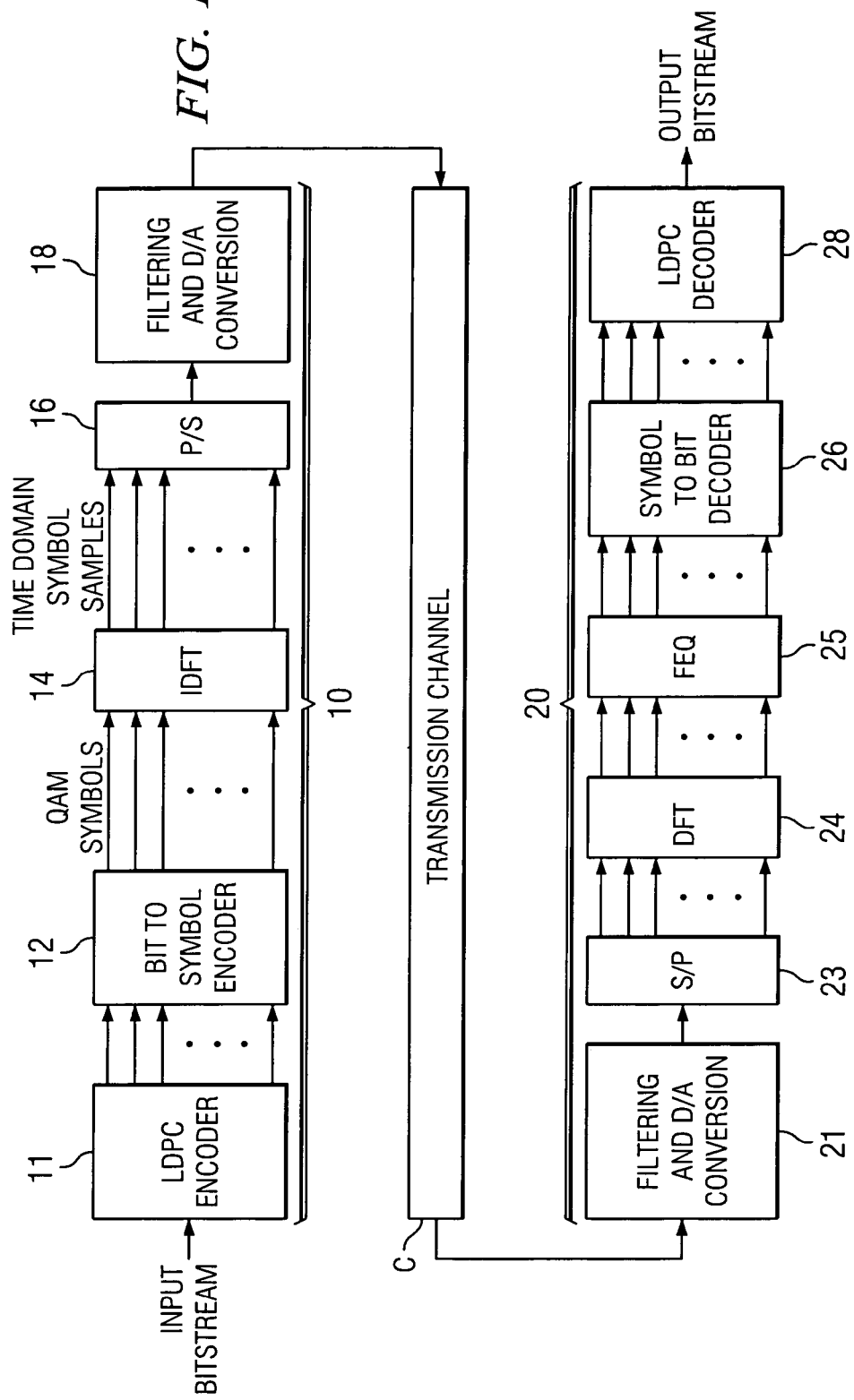
FIG. 1 is a functional block diagram of communications between two OFDM transceivers, where at least the receiving transceiver is constructed according to a first preferred embodiment of the invention.

FIG. 1 functionally illustrates an example of a somewhat generalized communication system into which the preferred embodiment of the invention is implemented. The illustrated system corresponds to an OFDM modulation arrangement, as useful in OFDM wireless communications as contemplated for IEEE 802.11 wireless networking. The data flow in this approach is also analogous to Discrete Multitone modulation (DMT) as used in conventional DSL communications, as known in the art. It is contemplated that this generalized arrangement is provided by way of context only. In the system of FIG. 1, only one direction of transmission (from transmitting transceiver 10 over transmission channel C to receiving transceiver 20) is illustrated. It will of course be understood by those skilled in the art that data will also be communicated in the opposite direction, in which case transceiver 20 will be the transmitting transceiver and transceiver 10 the receiving transceiver.

As shown in FIG. 1, transmitting transceiver 10 receives an input bitstream that is to be transmitted to receiving transceiver 20. The input bitstream may be generated by a computer at the same location (e.g., the central office) as transmitting transceiver 10, or alternatively and more likely is generated by a computer network, in the Internet sense, that is coupled to transmitting transceiver 10. Typically, this input bitstream is a serial stream of binary digits, in the appropriate format as produced by the data source.

The input bitstream is received by LDPC encoder function 11, according to this embodiment of the invention. LDPC encoder function 11 digitally encodes the input bitstream by applying a redundant code for error detection and correction purposes. According to this embodiment of the invention, the redundant LDPC code applied by encoder function 11 is selected in a manner that facilitates implementation and performance of the corresponding decoder in receiving transceiver 20. The specifics of the code will become apparent from the description of this decoder function, presented below relative to the description of the construction and operation of receiving transceiver 20. An example of encoder function 11 according to the preferred embodiment of the invention is described in copending and commonly assigned application Ser. No. 10/724,280, filed Nov. 28, 2003 published as U.S. Patent Application Publication No. US 2004/0148560, and incorporated herein by this reference. In general, the coded bits include both the payload data bits and also code bits that are selected, based on the payload bits, so that the application of the codeword (payload plus code bits) to the sparse LDPC parity check matrix equals zero for each parity check row. After application of the LDPC code, bit to symbol encoder function 12 groups the incoming bits into symbols having a size, for example, ranging up to as many as fifteen bits. These symbols will modulate the various subchannels in the OFDM broadband transmission.

The encoded symbols are then applied to inverse Discrete Fourier Transform (IDFT) function 14. IDFT function 14 associates each input symbol with one subchannel in the transmission frequency band, and generates a corresponding number of time domain symbol samples according to the Fourier transform. These time domain symbol samples are then converted into a serial stream of samples by parallel-to-serial converter 16. Functions 11 through 16 thus convert the input bitstream into a serial sequence of symbol values representative of the sum of a number of modulated subchannel carrier frequencies, the modulation indicative of the various data values, and including the appropriate redundant code bits for error correction. Typically, for an input of N/2 complex symbols, IDFT function 14 outputs a block of N real-valued time domain samples. Those skilled in the art having reference to this specification will readily recognize that each of functions 11 through 16 may be carried out, and preferably actually are carried out, as digital operations executed by a digital signal processor (DSP).

Filtering and conversion function 18 then processes the datastream for transmission. Function 18 applies the appropriate digital filtering operations, such as interpolation to increase sample rate and digital low pass filter for removing image components, for the transmission. The digitally-filtered datastream signal is then converted into the analog domain and the appropriate analog filtering is then applied to the output analog signal, prior to its transmission.

The output of filter and conversion function 18 is then applied to transmission channel C, for forwarding to receiving transceiver 20. The transmission channel C will of course depend upon the type of communications being carried out. In the wireless communications context, the channel will be the particular environment through which the wireless transmission takes place. Alternatively, in the DSL context, the transmission channel is physically realized by conventional twisted-pair wire. In any case, transmission channel C adds significant distortion and noise to the transmitted analog signal, which can be characterized in the form of a channel impulse response.

This transmitted signal is received by receiving transceiver 20, which, in general, reverses the processes of transmitting transceiver 10 to recover the information of the input bitstream.

Figure 2:
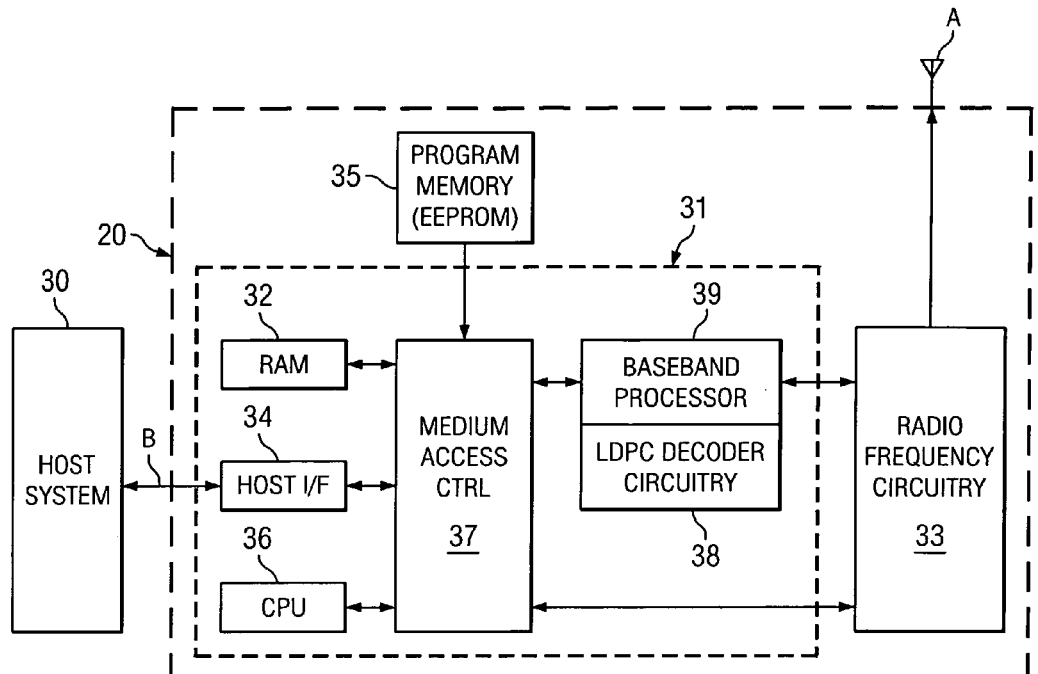
FIG. 2 is an electrical diagram, in block form, of a transceiver constructed according to the preferred embodiments of the invention.

FIG. 2 illustrates an exemplary construction of receiving transceiver 20, in the form of a wireless network adapter. Transceiver 20 is coupled to host system 30 by way of a corresponding bus B. Host system 30 corresponds to a personal computer, a laptop computer, or any sort of computing device capable of wireless networking in the context of a wireless LAN; of course, the particulars of host system 30 will vary with the particular application. In the example of FIG. 2, transceiver 20 may correspond to a built-in wireless adapter that is physically realized within its corresponding host system 30, to an adapter card installable within host system 30, or to an external card or adapter coupled to host computer 30. The particular protocol and physical arrangement of bus B will, of course, depend upon the form factor and specific realization of transceiver 20. Examples of suitable buses for bus B include PCI, MiniPCI, USB, CardBus, and the like.

Transceiver 20 in this example includes spread spectrum processor 31, which is bidirectionally coupled to bus B on one side, and to radio frequency (RF) circuitry 33 on its other side. RF circuitry 33, which may be realized by conventional RF circuitry known in the art, performs the analog demodulation, amplification, and filtering of RF signals received over the wireless channel and the analog modulation, amplification, and filtering of RF signals to be transmitted by transceiver 20 over the wireless channel, both via antenna A. The architecture of spread spectrum processor 31 into which this embodiment of the invention can be implemented follows that of the TNETW1100 single-chip WLAN medium access controller (MAC) available from Texas Instruments Incorporated. This exemplary architecture includes embedded central processing unit (CPU) 36, for example realized as a reduced instruction set (RISC) processor, for managing high level control functions within spread-spectrum processor 31. For example, embedded CPU 36 manages host interface 34 to directly support the appropriate physical interface to bus B and host system 30. Local RAM 32 is available to embedded CPU 36 and other functions in spread spectrum processor 31 for code execution and data buffering. Medium access controller (MAC) 37 and baseband processor 39 are also implemented within spread-spectrum processor 31 according to the preferred embodiments of the invention, for generating the appropriate packets for wireless communication, and providing encryption, decryption, and wired equivalent privacy (WEP) functionality. Program memory 35 is provided within transceiver 20, for example in the form of electrically erasable/programmable read-only memory (EEPROM), to store the sequences of operating instructions executable by spread-spectrum processor 31, including the coding and decoding sequences according to the preferred embodiments of the invention, which will be described in further detail below. Also included within wireless adapter 20 are other typical support circuitry and functions that are not shown, but that are useful in connection with the particular operation of transceiver 20.

According to the preferred embodiments of the invention, LDPC decoding is embodied in specific custom architecture hardware associated with baseband processor 39, and shown as LDPC decoder circuitry 38 in FIG. 2. LDPC decoder circuitry 38 is custom circuitry for performing the coding and decoding of transmitted and received data packets according to the preferred embodiments of the invention. Examples of the particular construction of LDPC decoder circuitry 38 according to the preferred embodiment of this invention will be described in further detail below.

Alternatively, it is contemplated baseband processor 39 itself, or other computational devices within transceiver 20, may have sufficient computational capacity and performance to implement the decoding functions described below in software, specifically by executing a sequence of program instructions. It is contemplated that those skilled in the art having reference to this specification will be readily able to construct such a software approach, for those implementations in which the processing resources are capable of timely performing such decoding.

Referring back to the functional flow of FIG. 1, filtering and conversion function 21 in receiving transceiver 20 processes the signal that is received over transmission channel C. Function 21 applies the appropriate analog filtering, analog-to-digital conversion, and digital filtering to the received signals, again depending upon the technology of the communications. In the DSL context, this filtering can also include the application of a time domain equalizer (TEQ) to effectively shorten the length of the impulse response of the transmission channel H. Serial-to-parallel converter 23 converts the filtered datastream into a number of samples that are applied to Discrete Fourier Transform (DFT) function 24. Because, in this OFDM context, the received signal is a time-domain superposition of the modulated subchannels, DFT function 24 recovers the modulating symbols at each of the subchannel frequencies, reversing the IDFT performed by function 14 in transmitting transceiver 10. DFT function 24 outputs a frequency domain representation of a block of transmitted symbols, multiplied by the frequency-domain response of the effective transmission channel. Recovery function 25 then effectively divides out the frequency-domain response of the effective channel, for example by the application of a frequency domain equalizer (FEQ), to recover an estimate of the modulating symbols. Symbol-to-bit decoder function 26 then demaps the recovered symbols, and applies the resulting bits to LDPC decoder function 28.

LDPC decoder function 28 reverses the encoding that was applied in the transmission of the signal, to recover an output bitstream that corresponds to the input bitstream upon which the transmission was based. This output bitstream is then forwarded to the host workstation or other recipient.

LDPC Decoding

The theory of operation of the preferred embodiment of the invention will now be described, following which its implementation into LDPC decoding function 28 in transceiver 20, in the form of LDPC decoder circuitry 38 operating in cooperation with baseband processor 39, will then be described.

By way of nomenclature, the LDPC code is fundamentally contained within an mxj parity check matrix H that satisfies the following equation, when multiplied by the true transmitted code word vector c:

$$H \cdot c = 0 \qquad (5)$$

over Galois Field (2). For a single one of the m rows in parity check matrix H, this parity check amounts to:

$$H_1 c_1 + H_2 c_2 + \ldots + H_j c_j = 0 \qquad (6a)$$

over GF(2). The parity-check equation (6a) thus logically becomes, for an exemplary row of matrix H having a "1" in its columns 1, 3, 4, and 7:

$$c_1 \oplus c_3 \oplus c_4 \oplus c_7 = 0 \qquad (6b)$$

According to conventional techniques, once the coding matrix H is defined, the encoding of a message frame can be executed in a straightforward if not brute force manner, using conventional programmable integrated circuits such as digital signal processors and the like. Examples of recent encoding techniques are described in Richardson and Urbanke, "Efficient Encoding of Low-Density Parity-Check Codes", *IEEE Trans. on Information Theory*, Vol. 47, No. 2 (February 2001), pp. 638–656, and in copending and commonly assigned application Ser. No. 10/724,280, filed Nov. 28, 2003, and incorporated herein by reference.

On the decoding side, one can define a set N(m) as the set of all bit indices (columns) in a given row m for which codeword bits contribute to the checksum (i.e., all bit indices for which the entries of parity check matrix H in row m are 1). The checksum equation for a row of the parity check can be expressed as:

$$\sum_{n \in N(m)} c_n = 0 \qquad (7)$$

over GF(2) or, logically, the exclusive-OR of the input bits $c_j$ that correspond to column bits in the row having a 1 value. One can thus determine, for a given codeword vector c, whether an error is present by determining whether this equation is true for each row of the parity check matrix H.

In practice, however, the actual input bit values $r_j$ that are recovered after demodulation and that are to be interpreted as codeword vector c by a decoder, for example by decoding function 28 in transceiver 20 of FIG. 1, are not binary values. Rather, these bit values are expressed as a fractional value, for example between ±1, expressed in several bits (e.g., six or seven). In effect, the input bit values $r_j$ can be considered as, and converted to, probabilities that their respective bit is a 0 (or conversely a 1). As known in this art, the log likelihood ratio (LLR) is a commonly used representation for these probabilities:

$$L(r_j) = \log\left(\frac{P(c_j = 0)}{P(c_j = 1)}\right) \qquad (8)$$

which can of course take negative and positive values, corresponding to 1 and 0 being more likely, respectively. For this description of the preferred embodiment of the invention, one can assume that the incoming LLRs (i.e., the received data) have the form $$-2r_j/\sigma^2$$

where $\sigma^2$ represents channel noise variance.

Fundamentally, the LDPC decoding process according to the preferred embodiment of the invention involves an iterative two-step process:

1. Estimate a value $R_{mj}$ for each of the j input nodes in each of the m rows of the checksum, using the current probability values from the other input nodes, and setting the result of the checksum for row m to 0; and
2. Update the sum $L(q_j)$ for each of the j input nodes from a combination of at most m values of $R_{mj}$ in the same column.

The iterations continue until a termination criterion is reached. A preferred termination criteria is the earlier of (i) evaluation of the matrix operation H·c=0 (mod 2), using "hard" decisions from the LLRs $L(q_j)$ as the codeword vector c, and (ii) completion of a specified number of iterations.

According to the preferred embodiment of the invention, the rows of parity check matrix H are grouped into non-overlapping subsets, where each column in the subset has a maximum column weight of one, meaning at most one non-zero entry. Each subset can then be processed as a unit, and the subsets are then processed one after another, using the results from the previous subset.

Mathematically, the process begins with an initialized estimate for the LLRs $L(r_j)$, $\forall j$, using the received soft data. Typically, for AWGN channels, this initial estimate is $$-2r_j/\sigma^2,$$

as known in the art. The per-row (or extrinsic) LLR probabilities are then derived:

$$L(q_{mj}) = L(q_j) - R_{mj} \quad (9)$$

for each column j of each row m of the checksum subset. These per-row probabilities amount to an estimate for the probability of the input node value, excluding the contribution to the estimate for each row from the row itself. One can then derive an amplitude $A_{mj}$ and a sign value $s_{mj}$ as follows:

$$A_{mj} = \sum_{n \in N(m); n \neq j} \Psi(L(q_{mn})) \quad (10)$$

While one may use any one of a number of computational forms for equation (10), an example of the function $\Psi$ according to a preferred embodiment of this invention is:

$$\Psi(x) \equiv \log(|\tanh(x/2)|) = \log(\tanh|x/2|) \quad (11)$$

The function $\Psi$ is its own negative inverse: $\Psi(\Psi(x)) = -|x|$. For computational ease, one can express tan h(L/2) as:

$$\tanh\left(\frac{L}{2}\right) = \left(\frac{e^L - 1}{e^L + 1}\right) \quad (12)$$

The sign is determined from:

$$s_{mj} = \prod_{n \in N(m); n \neq j} \mathrm{sgn}(L(q_{mn})) \quad (13)$$

which is simply an odd/even determination of the number of negative probabilities, excluding each row's own contribution. The updated estimate of each value $R_{mj}$ becomes:

$$R_{mj} = -s_{mj} \Psi(A_{mj}) \quad (14)$$

The negative sign of value $R_{mj}$ contemplates that the function $\Psi$ is its own negative inverse. The value $R_{mj}$ thus corresponds to an estimate of the LLR for input node j as derived from the other input nodes in the mth row of the parity check matrix, not using the value for input node j itself.

In the second step of each decoding iteration, the LLR estimates for each input node are updated. According to the preferred embodiment of this invention, this is performed over each column (i.e., each input node) as follows:

$$L(q_j) = L(q_{mj}) + R_{mj} \quad (15)$$

where the estimated value $R_{mj}$ is the most recent update, from equation (14) in this derivation. This column estimate will be used in the hard decision check. This is in contrast to the value of $R_{mj}$ that is used in equation (9) for this iteration, which is the value that was generated from the previous iteration over this subset of parity check matrix H.

As described in copending and commonly assigned application Ser. No. 10/329,597 filed Dec. 26, 2002, published as U.S. Patent Application Publication No. US 2004/0034828 A1, and incorporated herein by this reference, the determination of whether the iterations have converged to an error free decoding is based on the per-column LLRs $L(q_j)$:

$$L(q_j) \leq 0, \Rightarrow c_j = 0 \quad (18a)$$

$$L(q_j) < 0, \Rightarrow c_j = 1 \quad (18b)$$

The codeword vector $c = \{c_0, c_1, \ldots C_N\}$ is then applied to the parity check matrix H to determine if the product is zero, which as noted above indicates that codeword vector c is a valid codeword, from which the payload data portion can be readily extracted.

According to the preferred embodiment of the invention, the encoding function is described in detail in copending and commonly assigned application Ser. No. 10/724,280, filed Nov. 28, 2003 published as U.S. Patent Application Publication No. US 2004/0148560, incorporated herein by reference. However, it is the decoding operation that requires significant computational power, considering that the received datastream is expected to include some frequency of errors, as evident by the use of redundant coding to begin with. Accordingly, the computational complexity and performance of decoding circuitry has significant practical importance, and is often the deciding factor in whether a particular code is practically useful.

The particular codes that are useful in connection with the preferred embodiment of the invention are irregular LDPC codes, because of the improved error rate performance provided by such codes. As described in copending and commonly assigned application Ser. No. 10/329,597 filed Dec. 26, 2002, published as U.S. Patent Application Publication No. US 2004/0034828 A1, incorporated herein by reference, these codes tend to have a distribution of degrees over its input nodes, and possibly also over its check nodes. A preferred example of an optimization tool for deriving such codes is a web-based tool known as "ldpcopt", which is readily available at http://lthcwww.epfl.ch/research/ldpcopt/ and is described in Richardson et al., "Design of Capacity-Approaching Irregular Low-Density Parity-Check Codes", *Transactions on Information Theory*, Vol. 47, No. 2 (IEEE, February 2001), pp. 619–637; and in Chung, et al., "Analysis of sum-product decoding of low-density parity-check codes using a Gaussian approximation", *Transactions on Information Theory*, Vol. 47, No. 2 (IEEE, February 2001), pp. 657–670; both incorporated herein by this reference. The optimization criteria used by this exemplary process minimizes the bit error rate for the code, by varying the variable degrees of the LDPC parity check matrix. The results of the optimization provide the optimum numbers of "1" values (but not position) in parity check matrix H.

In the LDPC code according to the preferred embodiments of the invention, and as described in copending and commonly assigned application Ser. No. 10/329,597 filed Dec. 26, 2002, published as U.S. Patent Application Publication No. US 2004/0034828 A1, incorporated herein by reference, parity check matrix H is arranged into a composite of circularly shifted identity matrices, this composite being represented by a macro matrix $H_M$. Each entry in macro matrix $H_M$ represents a circularly shifted identity matrix, and initially takes either a 1 or a 0 value. As will be described below, an entry in macro matrix $H_M$ with a 1 value symbolizes a q×q circularly shifted identity matrix, while entries with a 0 value symbolize a q×q zero matrix. In alternative codes, the non-zero-valued entries of macro matrix $H_M$ may represent other types of permutation or cyclic matrices, but it is believed that the encoding in such cases will be more complex than in this example using circularly shifted identity matrices.

Macro matrix $H_M$ is thus itself a matrix, of dimensions c by d, in which each entry ("block") indicates the position of a q×q matrix in parity check matrix H, and in which the value of each entry symbolizes the form of the corresponding q×q matrix at that position. Each row of macro matrix $H_M$ thus defines a "block row" of q rows of parity check matrix H; conversely, each column of macro matrix $H_M$ defines a "block column" of q columns in parity check matrix H. As such, this description will refer to rows of macro matrix $H_M$ as "block rows", and columns of macro matrix $H_M$ as "block columns". In the preferred embodiments of this invention, a zero value of an entry in macro matrix $H_M$ symbolizes a zero-valued q×q matrix (i.e., all entries in the q×q matrix are zero). A non-zero value (e.g., 1) of an entry in macro matrix $H_M$ symbolizes the location of a permutation matrix, which in the preferred embodiments of the invention is a cyclically (or circularly) shifted identity matrix.

The optimization of the codes used according to the preferred embodiments of this invention is described in copending and commonly assigned application Ser. No. 10/329,597 filed Dec. 26, 2002, published as U.S. Patent Application Publication No. US 2004/0034828 A1, incorporated herein by reference.

FIG. 3 illustrates an example of macro matrix $H_M$, which represents a matrix of matrices, for a code rate ½ code. Each entry of macro matrix $H_M$ itself represents a square matrix of dimensions q×q. Each empty entry ("0") of macro matrix $H_M$ constitutes an empty q×q matrix (all entries are "0"). Each filled entry ("1") of macro matrix $H_M$ constitutes a permutation q×q matrix, each formed as an identity matrix with its rows cyclically shifted (modulo q), by an amount $P_{s,t}=b^s a^t$, where s, t represent the row and column positions, respectively, of the permutation matrix within macro matrix $H_M$, and a, b are the generator values. These additional code parameters q, a, b, are selected in determination of the code, as described in copending and commonly assigned application Ser. No. 10/329,597 filed Dec. 26, 2002, published as U.S. Patent Application Publication No. US 2004/0034828 A1, incorporated herein by reference. As described therein, these parameters include prime number q that defines the size of the constituent matrices within macro matrix $H_M$, and the generators a, b that are used in the definition of the constituent matrices within macro matrix $H_M$. Generator a is selected to have multiplicative order d with respect to prime q, and generator b has multiplicative order c also with respect to prime q. These parameters define the size of parity check matrix H, the total number of its rows and columns, and thus define the appearance of the LDPC code.

The manner in which the permutation matrices are formed is described in Sridhara, et al., "Low Density Parity Check Codes from Permutation Matrices", 2001 *Conference on Information Sciences and Systems* (Johns Hopkins University, Mar. 21–23, 2001), incorporated herein by this reference. In contrast to the Sridhara approach, however, macro matrix $H_M$ according to the preferred embodiments of this invention is irregular, in that it is itself relatively sparse, including many zero-valued entries. As will be evident from the following description, the irregularity included by the code designer, in combination with grouping of block columns of macro matrix $H_M$, provides a high performance LDPC code that can be efficiently implemented in hardware.

It is also contemplated, in connection with this invention, that the cyclic shifts of the identity matrices corresponding to the row and column position of macro matrix $H_M$ need not follow this particular approach. Indeed, the offset of the cyclic shift within a particular permutation matrix can be an arbitrary selection. Such arbitrary assignment, if followed, may affect the ultimate dimensions of macro matrix $H_M$.

The example of FIG. 3 illustrates an irregular macro matrix $H_M$ constructed according to this embodiment of the invention, in which the irregularity and the block construction is evident. It is contemplated that those skilled in the art, having reference to this specification, will be readily able to construct macro matrices and the resulting corresponding parity check matrices in this manner, for other code rates and performance optimization levels.

Figure 4:
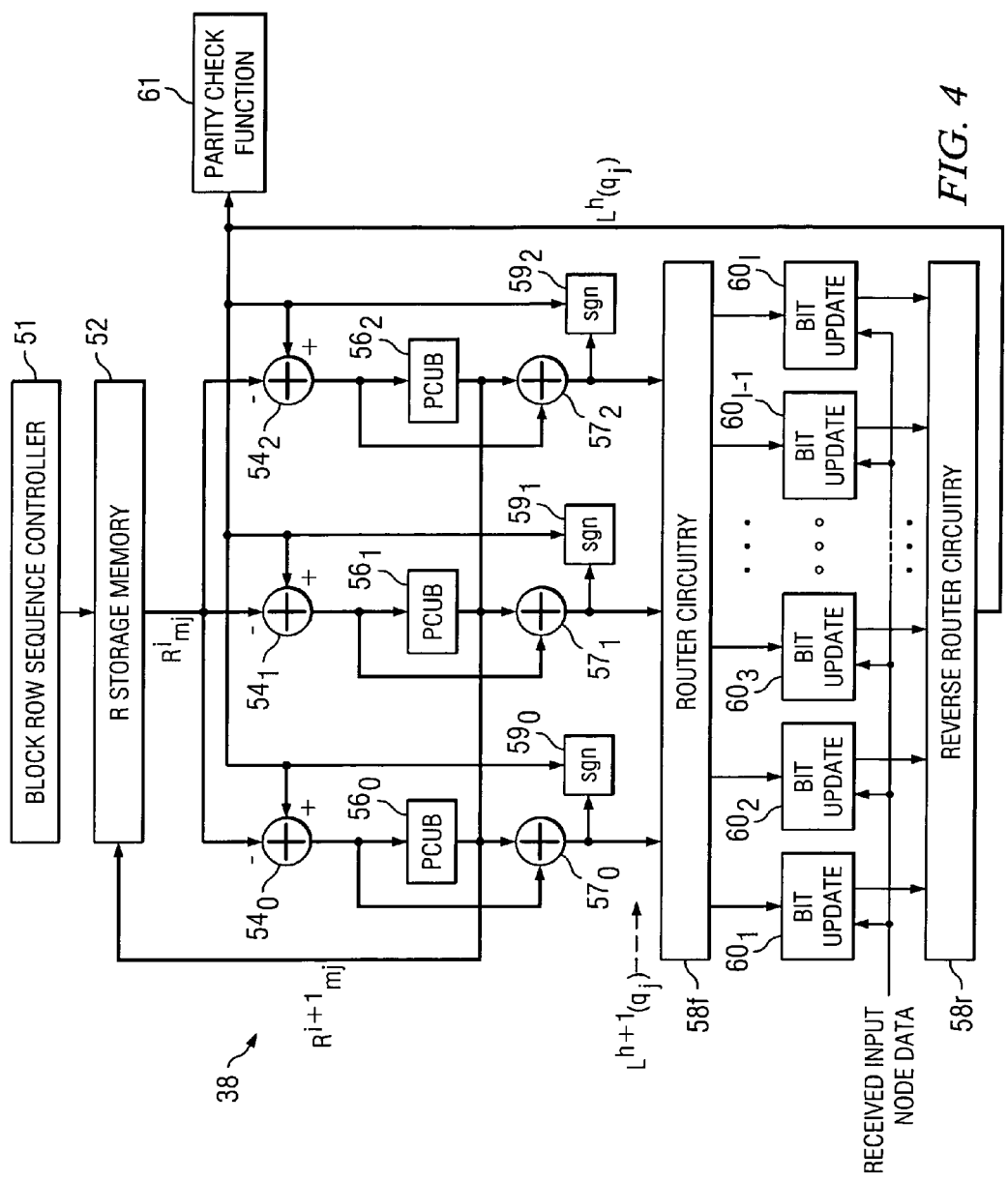
FIG. 4 is an electrical diagram, in block form, of an LDPC decoder according to a first preferred embodiment of the invention.

Referring now to FIG. 4, the construction of LDPC decoder 38 according to a preferred embodiment of the invention will now be described in detail. While it is also contemplated, according to this invention, that the LDPC decoding operations described herein may alternatively be performed as a software routine, for example by baseband processor 39 in the form of a DSP or another programmable logic device executing a sequence of program instructions, the exemplary architecture of FIG. 4 is especially well-suited to the irregular LDPC codes described above, and provide the important benefit of efficient and rapid performance provided by performing iterative belief propagation decoding in a layered, "turbo", fashion.

As shown in FIG. 4, LDPC decoder 38 includes memory 52, which is preferably a local random access memory (RAM) for storing the $R_{mj}$ estimates that are derived within each iteration of the belief propagation. These $R_{mj}$ estimates are the most recent estimates generated by parity check update blocks (PCUBs) 56, and will be the $R_{mj}$ values to be used in the next $(i+1)^{th}$ iteration; as such, FIG. 4 shows these values as values $R^{i+1}{}_{mj}$. In this example, the $R_{mj}$ values stored by memory 52 are packed, for efficiency of memory chip area, and to permit the generation of new values in parallel. In the arrangement of FIG. 4, three parity check update blocks $56_0$ through $56_2$ are provided, and as such memory 52 stores the $R_{mj}$ values for three corresponding rows m in each data word. The use of three parity check update blocks $56_0$ through $56_2$ is provided by way of example only; in general, the parallelization factor defined by the number of parallel parity check update blocks 56 can vary from one to any desired number, depending on the particular application and available resources.

As shown in FIG. 4, block row sequence controller 51 controls the addressing of R storage memory 52, and thus controls the sequence in which the subsets of rows of the $R_{mj}$ values are presented to adders 54. Controller 51 preferably also controls the other functions in decoder 38 to effect the decoding processes described in this specification. It has been discovered, in connection with this invention, that the particular sequence in which the subsets of rows are processed within each decoding "super-iteration" (i.e., instance of processing all rows in parity check matrix H) can affect the error rate performance of the decoding operation. Accordingly, it may be beneficial, in some instances, to alter the block row sequence between "super-iterations" in order to obtain improved error rate performance. Block row sequence controller 51 is therefore provided, according to the preferred embodiment of the invention, to control the sequencing through R storage memory 52, and is preferably programmable using standard techniques to define and alter the block row, or subset, processing sequence.

R storage memory 52 has an output coupled to a subtracting input of each of parallel adders $54_0$ through $54_2$, to provide the subtrahend for a subtraction performed by each of those adders 54 according to equation (9) described above. For the $i^{th}$ iteration through the entire parity check matrix H (i.e., "super-iteration"), the $R_{mj}$ values provided by memory 52 are the values $R^i_{mj}$ generated by PCUBs 56 in the previous update iteration. The outputs of parallel adder 54, which present the so-called "extrinsic" value estimates $L(q_{mj})$, are applied to corresponding PCUBs 56. Parity check update circuits 56 perform the updating of estimates $R_{mj}$ for each of the parity check nodes according to equations (10), (13), and (14) described above and in the manner that will be described in further detail below, producing the new values $R^{i+1}_{mj}$ that are stored in R memory 52.

According to this embodiment of the invention, the construction of each of parity check update blocks 56 is preferably as described in copending and commonly assigned application Ser. No. 10/329,597 filed Dec. 26, 2002, published as U.S. Patent Application Publication No. US 2004/0034828 A1, incorporated herein by reference. As described therein, each PCUB 56 applies its incoming extrinsic value estimates $L(q_{mj})$ from its corresponding adder 54 to look-up tables to evaluate the $\Psi$ function of equation (11) for its current row m. PCUB 56 also preferably includes an augmented adder tree that sums the values $\Psi(L(q_{mj}))$ over all of the columns participating in its current associated row m of macro matrix $H_M$. The resulting sum is then applied to each of multiple adders within PCUB 56, one adder associated with each of the columns j contributing to the current row m, and each adder subtracting the corresponding LUT output, which is the column's own contribution, from the overall sum. The outputs of these column adders presents the set of amplitude values $A_{mj}$ corresponding to the result of equation (10), each associated with one of the columns j participating in this row; zero-valued columns j do not participate in the row, and thus do not have an amplitude value $A_{mj}$. The $\Psi$ function is then again applied to the amplitude values $A_{mj}$ in PCUBs 56, according to equation (14), and the appropriate sign is applied to the result, based on a logical combination of the sign bits according to an odd/even determination of the number of negative probabilities for the corresponding column, excluding each column's own contribution, as described above relative to equation (13), to effect the sign applied according to equation (14). The updated estimate values $R^{i+1}_{mj}$ are generated by PCUBs 56 for the i+1 iteration in this manner.

Alternatively, PCUBs 56 may instead follow an approach described in copending and commonly assigned application Ser. No. 10/329,597 filed Dec. 26, 2002, published as U.S. Patent Application Publication No. US 2004/0034828 A1, incorporated herein by reference, in which a special addition function [+] is applied to the $L(q_{mj})$ values, and those values summed to derive the updated estimate values $R^{i+1}_{mj}$ for the i+1 iteration. Variations of these parity check update approaches, and other alternative parity check update approaches, may also be realized within parity check update circuits 56, within LDPC decoding circuitry 38 according to this invention. The selection of the particular arithmetic approach will depend upon the available circuitry and performance of the specific implementation.

In addition, the outputs of parity check update circuits 56 are also forwarded to corresponding inputs of parallel adders 57. Adders 57 also receive, at another input, the output of corresponding adders 54, which are the per-row LLR probability estimates values $L(q_{mj})$ calculated according to equation (9), as used by the corresponding PCUB 56 in performing the parity check node update. Accordingly, adders 57 calculate the updated log likelihood ratio (LLR) estimates $L(q_j)$ for each input node, according to equation (15). These updated values $L(q_j)$ are then forwarded to router circuitry 58f.

Also according to the preferred embodiment of the invention, sign change detection circuits 59 are associated in connection with each of adders 57. Sign change detection circuits 59 compare the sign bits of the LLR estimates $L^h(q_j)$ for each input node from the previous subset, at the input of adders 54, with the sign bits of the updated LLR estimates $L^{h+1}(q_j)$ for those input nodes from the current subset, at the outputs of adder 57, to determine whether a difference is present for any column j. For example, sign change detection circuits 59 may be implemented by exclusive-OR functions, which operate in combination with parity check function 61 that receives input node updates $L(q_j)$. As will be described in further detail below, this detection of a difference in sign will be used in determining whether the decoding has converged to a valid result.

Router circuitry 58f is a bank of multiplexers and demultiplexers that forwards the appropriate estimate values $L(q_j)$ to the corresponding bit update circuits 60. Bit update circuits 60 are effectively accumulators, by way of which current values of the LLRs of the input nodes are maintained from iteration to iteration. The number of bit update circuits 60 depends upon the maximum number of groups of block columns of macro matrix $H_M$ in the particular code; for the code example of FIG. 3, nine bit update circuits 60 are provided. According to the preferred embodiment of the invention, bit update circuits 60 take advantage of the layering properties of the LDPC decoding, and are especially efficient because they function mainly to store the summed column terms $L(q_j)$ from equation (15). The specific construction of bit update circuits 60 will be described in further detail below.

Bit update blocks 60 also have inputs that permit initialization with received input node data values prior to the first iteration of the belief propagation. As mentioned above, the received input node data values are typically based on a multiple bit fractional value, for example expressed in six or seven bits, as produced after demodulation and recovery after frequency domain equalization (e.g., by functions 25 and 26 of FIG. 1). More specifically, because LDPC decoder 38 operates on LLRs, the initial input node data value is preferably expressed as the ratio $$\frac{-2r_j}{\sigma^2},$$

the value $r_j$ being the received data value.

Figure 5:
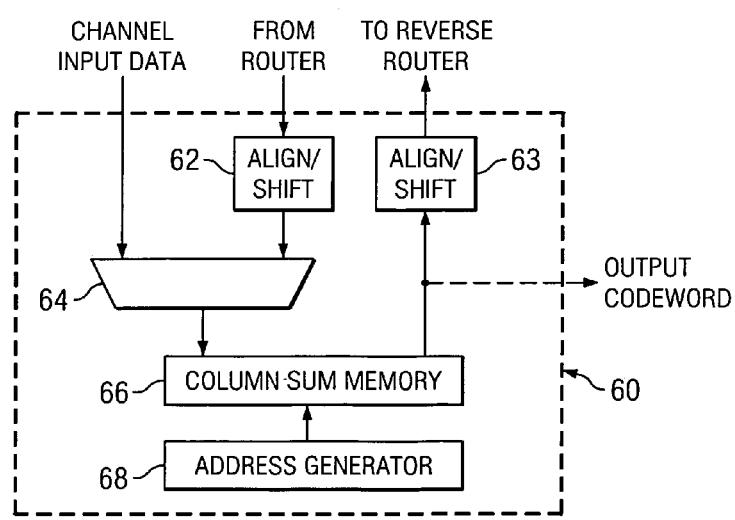
FIG. 5 is an electrical diagram, in block form, of a bit update circuit in the LDPC decoder of FIG. 4, according to the first preferred embodiment of the invention.

FIG. 5 illustrates the construction of a representative one of bit update blocks 60 according to the preferred embodiment of the invention. As mentioned above, bit update blocks 60 function primarily as storage for the summed column terms $L(q_j)$ as used in the belief propagation decoding. This storage is effected by column sum memory 66 in bit update block 60, which in this embodiment of the invention requires storage capacity of only a single memory entry per column j, organized so as to be properly addressable by address generator 68. Column sum memory 66 stores input values as selected by multiplexer 64; during initialization, the input values are the received channel input data (e.g., ratio $$\frac{-2r_j}{\sigma^2}$$

as described above). In later iterations, the input data is received from router 58f; if the parallelization factor of decoder 38 is greater than one, alignment of the incoming data values by shifting of the incoming data can be performed by align/shift block 62. On the output side, align/shift block 63 is provided to similarly shift the output data words before applying the output data to reverse router 58r; the eventual codeword is also output from column sum memory 66, as shown in FIG. 5.

According to the preferred embodiment of the invention, bit update blocks 60 can be implemented using a single column sum memory 66. This capability is enabled by the treating of the LDPC code as a layered code, in which the parity check matrix H is considered as multiple subsets, each subset corresponding to a group of matrix rows in which each column has a weight of at most one, and in which the decoding operation operates on one subset at a time. This constraint on the code, and the operation of decoder 38, guarantees that each column, or input node, LLR value $L(q_j)$ will be updated only once during the processing of a subset of rows. This in turn guarantees that, when a given input node LLR value $L(q_j)$ has just been updated, that same input node LLR value $L(q_j)$ will not be updated from other rows in that subset (or block row), and therefore need not be protected from overwriting during the processing of that same subset (or block row). Furthermore, this newly-updated input node LLR value $L(q_j)$ is immediately available for use by parity check update circuits 56 in processing the next subset of rows, or block rows; all rows in the parity check matrix H need not be processed before this updated value can be used.

This construction improves upon the approach described in copending and commonly assigned application Ser. No. 10/329,597 filed Dec. 26, 2002, published as U.S. Patent Application Publication No. US 2004/0034828 A1, incorporated herein by reference, in which two column sum memories are provided in each bit update unit in the LDPC decoder. In the approach of Publication No. US 2004/0034828 A1, updates for each column are stored in one column sum memory, while the other column sum memory is made available for forwarding the previously updated results; the column sum memory roles alternate, in ping-pong fashion. In contrast, the construction according to the preferred embodiment of this invention takes advantage of the properties of the layered decoding to dynamically update the LLR values $L(q_j)$. As a result, bit update blocks 60 according to this preferred embodiment of the invention can be constructed with two fewer memories, eliminating the memory for the received input values and also a second column sum memory, as compared to the construction described in Publication No. US 2004/0034828 A1.

Alternatively, in some code structures, a few columns, or column blocks in the macro matrix sense, may have relatively high weight. In this case, it may be preferred to provide a decoder that operates according to the layered mode described above for most columns, but that also operates (or has the capability of operating, if enabled) in a mode corresponding to that described in copending application Ser. No. 10/329,597 filed Dec. 26, 2002, published as U.S. Patent Application Publication No. US 2004/0034828 A1, incorporated herein by reference, for other column blocks. For example, referring to FIG. 4, one or more of the bit update blocks 60 could be constructed as described in this Publication No. US 2004/0034828 A1, rather than as shown in FIG. 5; in this case, adders 57 for these corresponding columns at PCUBs 56 would either be bypassed or otherwise not effected. It is contemplated that this alternative construction could also be implemented to be available under program control, for example by having all columns processed in the layered, or "turbo", manner as described above relative to FIG. 5 for some codes, or alternatively by selecting "standard" operation (i.e., according to Publication No. US 2004/0034828 A1) at some columns for other codes. It is contemplated that those skilled in the art having reference to this specification will be readily able to implement this alternative capability, without undue experimentation.

Referring back to FIG. 4, bit update blocks 60 each forward an output to reverse router circuitry 58r, which in turn applies the output value to parallel adders 54, as the minuends for the subtraction performed by that circuit. According to this embodiment of the invention, therefore, these values are the current bit update values $L^h(q_j)$ to be used in the current block row or subset (i.e., iteration h produces values $L^{h+1}(q_j)$ for use in the next iteration h+1 corresponding to the next subset). In addition, the outputs of bit update blocks 60 are also applied by reverse router circuitry 58r to parity check function 61, which performs a slicing function on these estimates, and after converting these values to "hard" decisions, determines whether the parity check equation is satisfied by the current estimates for each row of parity check matrix H.

The operation of LDPC decoder 38 in performing belief propagation decoding according to the preferred embodiment of the invention will now be described in further detail, relative to FIG. 6. For the sake of clarity, this description will correspond to an arbitrary selected "super-iteration" over all rows in parity check matrix H, which corresponds to an iteration over all subsets of rows of the parity check matrix H, and thus over all M rows. As mentioned above, initialization of the belief propagation operation begins with the receipt and storage, by bit update circuits 60, values corresponding to ratio $$\frac{-2r_j}{\sigma^2},$$

the value $r_j$ being the received data value, stored in the appropriate memory locations as the initial estimate of the LLRs for the columns.

This description of the operation of LDPC decoder 38 for this exemplary iteration, will begin with process 70, in which the first row m=0 (or group of rows corresponding to the number of PCUBs 56 in LDPC decoder 38, which is three rows for the example of FIG. 4) in a given subset k of parity check matrix H is selected. As mentioned above, parity check matrix H is preferably arranged as block matrix $H_M$, in which case the subset k corresponds to one of the block rows of block matrix $H_M$. In process 72, adders 54 receive the current estimates $R^i_{mj}$ for the participating columns in the current row or rows of parity check matrix H from memory 52. These current estimates $R^i_{mj}$, which were generated in the previous iteration i of the process, are subtracted from the current LLR values $L(q_j)$ of the input nodes that participate in the current group of rows of parity check matrix H, in process 74, to produce new values $L(q_{mj})$, as described above.

In process 76, PCUBs 56 generate new estimates of estimate values $R^{i+1}_{mj}$ for the $(i+1)^{th}$ iteration, using the incoming values $L(q_{mj})$ from corresponding adders 54. As described above, process 76 may be implemented by way of look-up tables in combination with an augmented tree adder, in combination with additional adders and sign determining circuitry. Alternative approaches for generating the estimate values $R^{i+1}{}_{mj}$ may also be used to realize process 76, as described above. These estimate values $R^{i+1}{}_{mj}$ are then stored in memory 52, in process 78, in preparation for the next iteration of processes 72 through 76 for the next row or group of rows in the current subset, or block row, of parity check matrix $H_M$.

In process. 80, adders 57 add the values $L(q_{mj})$ from process 74 to the new estimate values $R^{i+1}{}_{mj}$ to establish the new updated column LLR values $L^{h+1}(q_j)$ for those columns that are participating in the current row. As mentioned above, because of the layering of parity check matrix $H_M$ to ensure that column weights are at most one, the updating of column LLR values $L^h(q_j)$ in process 80 is necessarily accomplished for columns j that have not been previously updated within the current row subset k, and that will not again be updated during the processing of current row subset k. Accordingly, the updated column LLR values $L^{h+1}(q_j)$ are directly routed to bit update blocks 60 by way of router 58f, stored in the column sum memory 66, and routed back to parity check function 61 and to adders 54, as shown in FIG. 4. These new values are then available for the subtraction of process 74 for the next subset k+1.

In process 82, parity check function 61 evaluates the codeword equation Hc=0 using the current updated column LLRs $L^{h+1}(q_j)$, and decision 83 determines whether the decoding process has converged upon a valid result, by determining whether the codeword equation Hc=0, GF(2) evaluated in process 82 is satisfied. As such, parity check function 61 performs the function of "hard slicing" the current LLR values $L(q_j)$ to digital bit values 0 and 1 (e.g., by simply interrogating their sign bits), and then exclusive-ORs these bits to determine whether a 0 result is returned for that row m. It is contemplated that the circuitry or program instructions (e.g., executable by baseband processor 39) for performing this determination can be readily derived by those skilled in the art, having reference to this specification. The results of function 61 are effectively retained over all rows in macro matrix H, so that the ultimate termination decision can be made.

As discussed above relative to equation (5), the global codeword equation Hc=0 must be satisfied over all rows of parity check matrix H in order to arrive at the true decoding result. However, because of the layered property of the code, the LLR values $L(q_j)$ can vary from one subset of rows to another. As such, it is possible that the parity check values for prior subsets may become invalid. According to this preferred embodiment of the invention, LDPC decoder 38 monitors sign changes in the LLR values $L(q_j)$ over a full cycle of all rows in parity check matrix H; if the parity check equation is satisfied over all subsets and there is no change in any of the sign bits of the LLR values $L(q_j)$, then the codeword is valid. In other words, once a valid parity check result is returned (decision 83 is YES), then the sign bits of each of the input node LLRs $L(q_j)$ are monitored; upon the parity check evaluation remaining valid (i.e., equals 0) and the sign bits not changing over all M rows of parity check matrix $H_M$, LLR values corresponding to the true codeword result are present in column sum memory 66.

Figure 6:
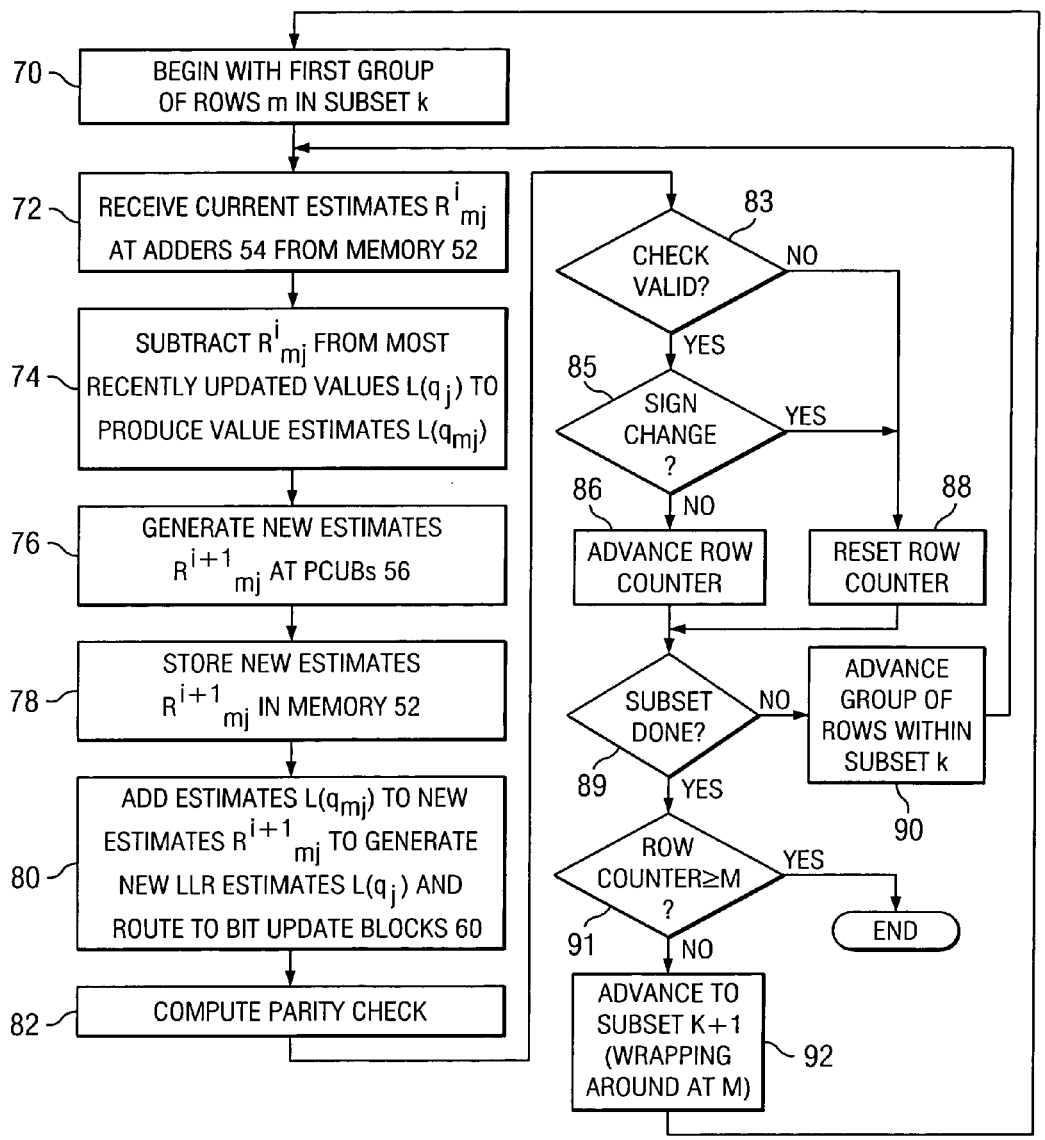
FIG. 6 is a flow chart illustrating a method for decoding an incoming codeword, according to the preferred embodiment of the invention.

According to the method illustrated in FIG. 6, therefore, upon a valid parity check result (decision 83 is YES), decision 85 is next performed by sign bit detection circuitry 59 to determine whether the sign bit of any of the input node LLRs $L(q_j)$ at the output of adders 57 changed from that derived in the previous block row, or subset. If not (decision 85 is NO), a row counter that is counting the number of successful rows, and which is contained within parity check function 61, for example, is advanced in process 86. If the parity check is false (decision 83 is NO) or if a sign change was detected (decision 85 is YES), this row counter is reset in process 88, regardless of the particular row within parity check matrix $H_M$.

In any case, decision 89 determines whether the current subset k is complete. If not, the next row or group of rows within subset k is selected for processing (which may have already begun, as mentioned above), beginning with process 72. If the most recently processed group of rows includes the last row within the current subset k, then the processing is completed for this subset. The row counter can then be tested, in process 91, to determine whether convergence has been reached; this is determined by comparing the contents of the row counter against the number M of rows in parity check matrix H. If the row counter indicates that fewer than M rows have been processed since the last parity check failure or sign bit change (decision 91 is NO), then the process advances to the next subset k+1 in process 92 (wrapping around back to zero, if the end of parity check matrix H is reached). As mentioned above, upon completion of a "super-iteration" in which the end of parity check matrix H is reached, it may be preferred to alter the sequence in which the subsets k are processed from one "super-iteration" to another. On the other hand, if M or more rows of successive valid parity checks and no sign bit changes have been processed (decision 91 is YES), then the solution of the decoding process has been reached. The "hard" slices of the input node LLRs thus match a valid decoding containing codeword c, because the codeword equation (5) has been verified for this current codeword c. Baseband processor 39 or other circuitry in transceiver 20 then retrieves the payload data from the hard decision codeword, based on the current contents of column sum memory 66, and the process is repeated for the next codeword or data block.

As noted above, this embodiment of the invention provides for excellent LDPC coding performance, with error rates approaching the Shannon limit, while still being readily and efficiently implementable in custom logic or in a sequence of program instructions. For example, several codes constructed in this manner have been investigated for their performance. For examples of rate ½ codes corresponding to FIG. 3, bit error rate (BER) performance exceeding that of conventional LDPC codes of analogous size was obtained, resulting in BERs of on the order of $3 \times 10^{-5}$ for Eb/No values of on the order of 1.2 dB. Similarly, for rate ¾ codes, improved BER performance relative to conventional LDPC codes has also been observed, with BERs on the order of $10^{-5}$ attained at Eb/No values also on the order of 2.8 dB. In each case, the BER performance of these LDPC codes has been observed to approach that of conventional third generation (3G) cellular turbo codes, but with much more efficient implementation and performance.

IN CONCLUSION

According to all of the preferred embodiments of the invention, a hardware efficient LDPC coding and decoding method and circuitry is provided. The code involves a high degree of irregularity, thus providing excellent performance, nearing the Shannon limit in some cases. This performance is attained while enabling relatively simple and robust hardware implementation, despite the irregular codes. In addition, the layered approach to the decoding problem, as implemented in the preferred embodiment of this invention, greatly reduces the hardware requirements for the decoding circuitry, primarily by reducing the size of the memories required for storing input node LLR values by a factor approaching two-thirds. In addition, the decoding performance is greatly improved, because the most recent updates to the input node LLRs are available for use in the parity check updates in the next subset of rows of the parity check matrix.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of decoding a data stream encoded according to a low density parity check (LDPC) code;
    wherein the LDPC code is represented by a parity check matrix, in which the rows of the parity check matrix are grouped into subsets in which each column has a maximum column weight of one, and wherein the columns of the parity check matrix correspond to input nodes and the rows of the parity check matrix correspond to parity check sums;
    the method comprising the steps of:
        receiving a set of input values corresponding to input nodes of the parity check matrix; and
        for each subset, repeating a sequence of steps comprising:
            for each row of the subset, subtracting a previous check node value from a probability value for each input node contributing to the parity check sum for that row;
            generating a new check node value for that row of the subset, using the result of the subtracting step; and
            for each input node contributing to the parity check sum for that row, updating a probability value using the new check node value and the result of the subtracting step.

2. The method of claim 1, wherein the parity check matrix is represented by a macro matrix having zero-valued and non-zero-valued entries arranged in block rows and block columns and in which each zero-valued entry corresponds to a q×q zero-valued matrix and each non-zero-valued entry corresponds to a q×q permutation matrix that has at most a single "1" entry in each row and each column and "0" entries elsewhere to define a parity check matrix.

3. The method of claim 1, further comprising:
    checking a parity check equation using the estimated probability values.

4. The method of claim 3, wherein the sequence further comprises:
    responsive to an instance of the step of checking the parity check equation indicating that current probability values correspond to a true solution, detecting changes in sign of updated probability values.

5. The method of claim 4, wherein the sequence further comprises:
    counting a number of rows for which no change in sign is detected by the detecting step; and
    responsive to the counting step reaching a selected value prior to an instance of the checking step indicating that current probability values do not correspond to a true solution, outputting a codeword from the current probability values.

6. The method of claim 5, wherein the checking step further comprises:
    slicing each probability value to a digital value.

7. The method of claim 1, wherein the received input values have a form corresponding to the ratio of twice a data value to a channel noise term.

8. The method of claim 1, wherein the sequence further comprises:
    storing updated probability values in a column sum memory.

9. The method of claim 1, wherein the sequence of steps is repeated for each subset in the parity check matrix, in a first sequence of subsets;
    and further comprising:
        again repeating the sequence of steps for each subset for each subset in the parity check matrix, in a second sequence of subsets.

10. Decoder circuitry for decoding a received signal stream that was encoded according to a low density parity check (LDPC) code;
    wherein the LDPC code is represented by a parity check matrix, in which the rows of the parity check matrix are grouped into subsets in which each column has a maximum column weight of one, and wherein the columns of the parity check matrix correspond to input nodes and the rows of the parity check matrix correspond to parity check sums;
    the circuitry comprising:
        a check node memory for storing estimates of check node values associated with each of the input nodes over each of a plurality of parity check sums of the LDPC code;
        a first adder coupled to the check node memory, for combining a check node value associated with a row of a subset of the parity check matrix with probability value estimates for input nodes participating in the parity check equation for the row corresponding to the check node value, to produce extrinsic estimates;
        a parity check update circuit, for updating the check node value using the output of the first adder, the updated estimate of the check node value associated with the participating input nodes, the output of the parity check update circuit coupled to the check node memory;
        a second adder, for adding the extrinsic estimates to the updated estimate of the check node value to produce updated probability values corresponding to the participating input nodes; and
        a plurality of bit update circuits, each for storing the updated probability values corresponding to a plurality of input nodes;
        routing circuitry, for routing the output of the second adder to the bit update circuits associated with its corresponding input node; and
        rerouting circuitry, for routing each updated probability value from the bit update circuits to the first adder.

11. The decoding circuitry of claim 10, wherein the LDPC code is represented by a macro matrix having zero-valued and non-zero-valued entries arranged in block rows and block columns and in which each zero-valued entry corresponds to a p×p zero-valued matrix and each non-zero-valued entry corresponds to a p×p permutation matrix that has at most a single "1" entry in each row and each column and "0" entries elsewhere to define a parity check matrix.

12. The decoding circuitry of claim 10, wherein each of the plurality of bit update circuits comprises a single column sum memory.

13. The decoding circuitry of claim 10, wherein at least one of the plurality of bit update circuits comprises a single column sum memory;

and wherein at least one of the plurality of bit update circuits comprises:
first and second column sum memories; and
circuitry for alternatively coupling the first and second column sum memories to the routing circuitry and rerouting circuitry, respectively.

14. The decoding circuitry of claim 12, wherein each of the plurality of bit update circuits comprises:
an input for receiving initializing estimates for each of the plurality of input nodes.

15. The decoding circuitry of claim 10, further comprising:
a plurality of first adders, in parallel;
a plurality of parity check update circuits, in parallel with one another; and
a plurality of second adders, in parallel with one another;
wherein the check node memory is arranged in data words, each data word storing check node estimates for a plurality of rows of the parity check matrix, each row corresponding to one of the plurality of first adders, a corresponding one of the plurality of parity check update circuits, and a corresponding one of the plurality of second adders.

16. The decoding circuitry of claim 10, further comprising:
a parity check function, for slicing the updated probability values and for evaluating a parity check equation using the sliced updated probability values.

17. The decoding circuitry of claim 16, further comprising:
sign detection circuitry, for detecting changes in sign of the updated probability values; and
a row counter, for counting a number of rows of the parity check matrix over which no change in sign has been detected by the sign detection circuitry.

* * * * *